United States Patent [19]

Choy

[11] Patent Number: 5,171,705
[45] Date of Patent: Dec. 15, 1992

[54] SELF-ALIGNED STRUCTURE AND PROCESS FOR DMOS TRANSISTOR

[75] Inventor: Benedict C. K. Choy, Saratoga, Calif.

[73] Assignee: Supertex, Inc., Sunnyvale, Calif.

[21] Appl. No.: 795,994

[22] Filed: Nov. 22, 1991

[51] Int. Cl.⁵ .......................................... H01L 21/336
[52] U.S. Cl. .................................... 437/41; 437/29; 437/150; 437/228; 437/978; 148/DIG. 43; 148/DIG. 126
[58] Field of Search ............ 148/DIG. 126, DIG. 43; 437/29, 41, 152, 155, 158, 150, 154, 44; 357/23.4

[56] References Cited

U.S. PATENT DOCUMENTS

| | | | |
|---|---|---|---|
| 4,417,385 | 11/1983 | Temple | 357/23.4 |
| 4,443,931 | 4/1984 | Baliga et al. | 357/23.4 |
| 4,644,637 | 2/1987 | Temple | 148/DIG. 126 |
| 4,689,872 | 9/1987 | Appels et al. | 437/41 |
| 4,705,759 | 11/1987 | Lidow et al. | 437/29 |
| 4,716,126 | 12/1987 | Cogan | 437/24 |
| 4,785,344 | 11/1988 | Franz | 357/23.4 |
| 4,809,047 | 2/1989 | Temple | 357/23.4 |
| 4,810,665 | 3/1989 | Chany | 437/30 |
| 4,879,254 | 11/1989 | Tsuzuki et al. | 437/41 |
| 4,960,723 | 10/1990 | Davies | 437/41 |

FOREIGN PATENT DOCUMENTS 2-296342 12/1990 Japan ......................... 148/DIG. 126

OTHER PUBLICATIONS

Mori, M., et al., "An Insulated Gate Bipolar Transistor with a Self-Aligned DMOS Structure", IEEE IEBM Tech. Digest, 1988, pp. 813–816.

Primary Examiner—T. N. Quach
Attorney, Agent, or Firm—Harry M. Weiss

[57] ABSTRACT

Method and structure is disclosed for a high-density DMOS transistor with an improved body contact. The improvement comprises a self-aligned structure in combination with a body contact region which overdopes the source region in order to minimize the number of critical photoresist steps. The use of two dielectric spacers obviates the need for a separate contact mask.

5 Claims, 2 Drawing Sheets

SELF-ALIGNED STRUCTURE AND PROCESS FOR DMOS TRANSISTOR

BACKGROUND OF THE INVENTION

1. Field of Invention

This invention relates generally to an improved electrical contact and method therefore for semiconductor devices and, more particularly, to an improved electrical contact to the body region of a DMOS transistor and method therefore that provides a self-aligned electrical contact which is more effective and requires less space than prior art electrical contact techniques.

2. Description of the Prior Art

U.S. Pat. Nos. 4,376,286 and 4,748,103, together with an article on Insulated Gate Bipolar Transistors, IEDM Technical Digest, PP 813-815, 1988, are exemplary of various approaches to fabricating DMOS transistors. The cited references all describe different approaches to achieving electrical contact to the body region of a DMOS transistor. In all of these structures, there exists a parasitic bipolar transistor formed by the drain substrate region acting as a collector, the body region (which contains the MOS channel) acting as the base, and the source region acting as an emitter. Lateral body current flow may cause the emitter-base junction to be forward biased causing undesirable latch-back breakdown to occur. Usually, a deep body contact diffusion is employed to minimize the drop caused by the lateral body current flow. This deep body contact often require extra space on the die, or results in alignment problems, while its omission results in poor transient performance.

Thus a need existed to provide an improved process and structure for the fabrication of a DMOS transistor with good energy capability and a relatively simple process flow.

SUMMARY OF THE INVENTION

In accordance with one embodiment of this invention, it is an object of this invention to provide a structure and a process for an improved electrical contact for a semiconductor device.

It is still another object of this invention to provide structure and process for an improved electrical contact to the body region of a DMOS transistor.

It is still another object of this invention to provide a structure and a method for a self-aligned electrical contact to the body region of a DMOS transistor.

It is a further object of this invention to provide a structure and a method for an improved electrical contact to the body region of a DMOS transistor whereby effective shorting of the parasitic bipolar transistor is achieved.

It is yet another object of this invention to provide a method and a structure whereby improved electrical contact to both the body and the source of a DMOS transistor can be achieved by the use of self-aligned process steps.

In accordance with a preferred embodiment of this invention, improved contact to the body region of a DMOS transistor is achieved by overdoping the source region of a DMOS transistor by a species of opposite conductivity type to the source and of the same conductivity type as the body region of the device. The overdoping species is kept away from the channel region by a sidewall spacer self-aligned to the gate of the DMOS device.

In accordance with another embodiment of this invention; a second sidewall spacer allows self-aligned electrical contact to both the source and the body region of the DMOS transistor.

The forgoing and other objects, features and advantages of the invention will be apparent from the following, more particular, description of the preferred embodiments of the invention as illustrated in the accompanying drawings.

DETAILED DESCRIPTION OF THE INVENTION

Figure 1:
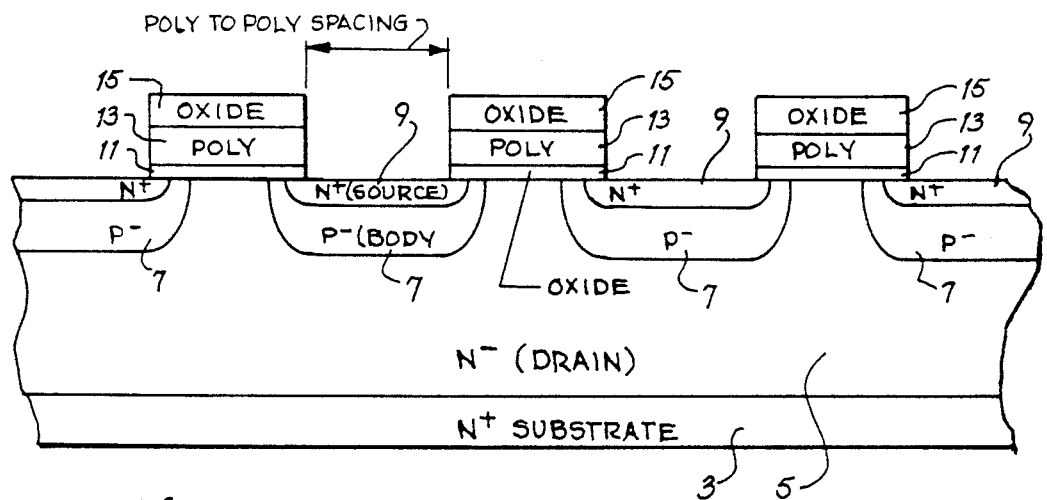
FIGS. 1 and 2 illustrate by side elevational sectional views a sequence of steps and a structure incorporating the features of the present invention.

Referring now to FIG. 1, the starting point of the invention is a semiconductor wafer comprising a relatively lightly doped drain region 5 of a first conductivity type over a heavily doped substrate 3 also of first conductivity type used as a contact to the lightly doped region 5. A gate insulation 11 is formed and overlaid by a gate conductor 13; such as doped polysilicon. An oxide layer 15 is formed over the gate polysilicon and all three layers 11, 13 and 15 are patterned to form spaced-apart gate regions 13. Using said gate regions as a mask, body regions 7 of a second conductivity type are formed by implanting a species of the second conductivity type at preferably a dose of from about $2 \times 10^{13}$ to about $3 \times 10^{14}$ atoms per square centimeter with a drive-in to ensure that the body regions 7 are beneath the overlying gate regions 13. The source regions 9 are preferably implanted or formed by introducing a heavy concentration of a species of first conductivity type with a dose of preferably from about $6 \times 10^{14}$ to about $6 \times 10^{15}$ atoms per square centimeter. This implant is then driven in to achieve the proper threshold for the DMOS device. FIG. 1 shows the cross-section of the device after this step.

Figure 2:
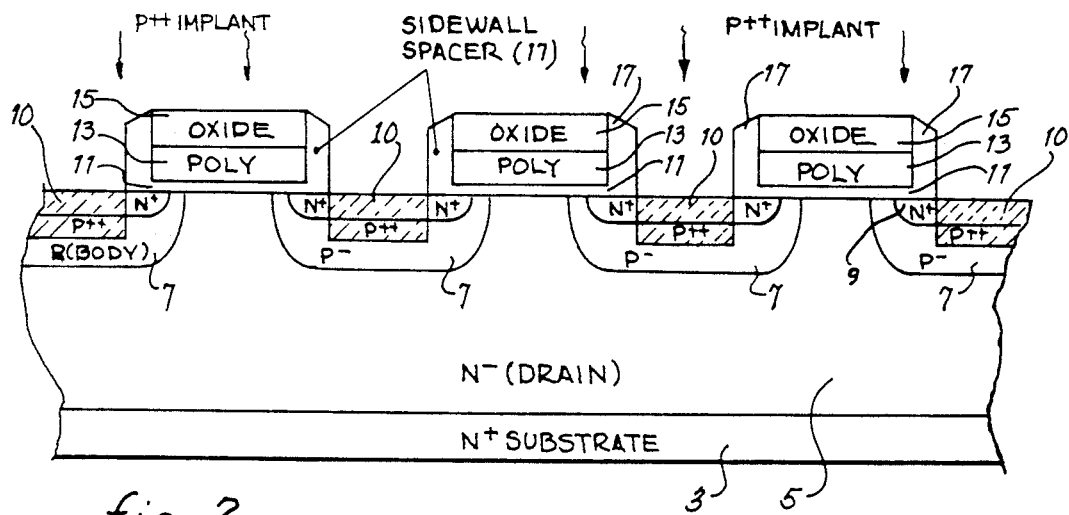

Referring now to FIG. 2, sidewall dielectric spacers 17 are formed at the edges of the doped polysilicon gates 13. These spacers can be formed by depositing a dielectric layer, such as an oxide, over the processed semiconductor wafer of FIG. 1 and using reactive ion etching to remove the horizontal portions of that dielectric layer, leaving behind only the vertical sidewall spacers 17, which desirably have a thickness of about 0.5 microns. Techniques for sidewall spacer formation are well known in the art.

Following the dielectric sidewall spacer formation, a species 10 of second conductivity (P) type with a dosage substantially higher than that used to form (N) source regions 9 is implanted through the openings between the spacers 17. Because of the higher implant dosage, this step converts the portions of the (N type) source region 9 not protected by the sidewall spacers 17 into regions 10 of second conductivity (P) type. Since the body regions 7 are of this same second conductivity (P) type, they are ohmically contacted by the (P type) regions 10. Since the sidewall spacers 17 are typically about 0.5 microns wide, the (P++) heavily-doped regions 10 of second conductivity type are only about 0.5 per away from the gate polysilicon 13 and only slightly farther away from the ends of the (N+) source regions 9. Lateral current flow can thus set up only very small potential drops, and the parasitic bipolar effect is minimized. Since the (P++) implanted regions 10 are self-aligned, the gate-to-gate polysilicon spacing can be made quite small without the need for high-accuracy alignment apparatus. Depending on the photo-resist resolution of the gate polysilicon task, gate-to-gate spacings of as little as 3 or 4 microns can be attained without the need for photoresist stepping equipment. Also, with reference to FIG. 2, the high-dosage contact implanted (P++) regions 10 do not interfere with the channel doping of the (P−) body regions 7 underneath the polysilicon gates 13.

Figure 3:
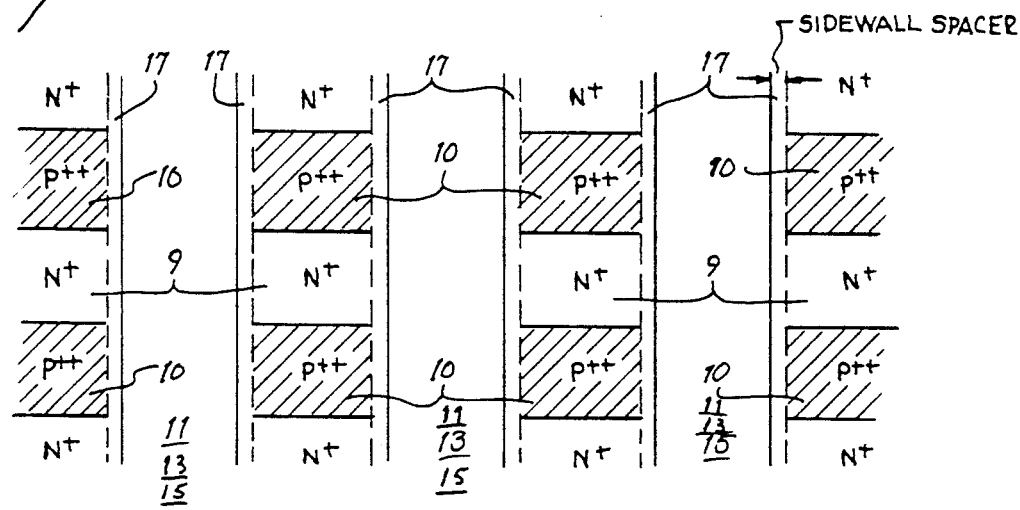
FIG. 3 is a top view of the contact scheme for the device of the present invention.

In order to minimize the voltage drop between the (P−) body regions 7 and the (N+) source regions 9, it is desirable to short the (N+) source regions 9 to the body contact (P++) regions 10 with a metalization layer. One way to accomplish this is shown in FIG. 3, which is a top view of the structure of FIG. 2. Here the gate regions comprising overlapping layers 11, 13 and 15 are separated by the (N+) doped source regions 9 which lie under the vertical sidewall spacers 17. The (P++) body contact regions 10 are partly blocked by an additional mask which leaves alternating (N+) source regions 9 and (P++) body contact regions 10 along the peripheries of the overlapping gate structures 11, 13 and 15. Following conventional metal deposition and definition, these regions will be electrically shorted to each other in each stripe. The blocking mask step does not require critical alignment.

Figure 4:
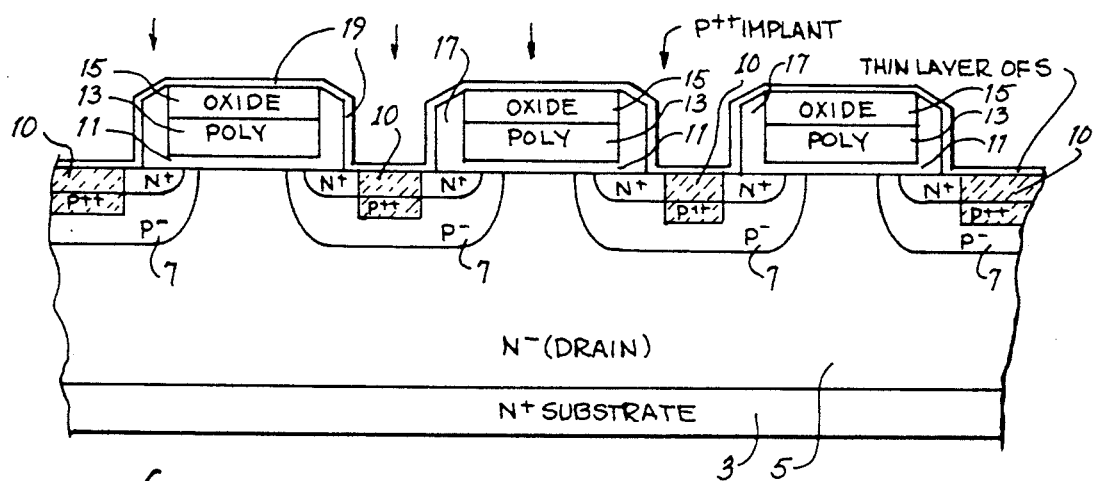
FIG. 4 is a side elevational sectional view illustrating a structure and method for providing a self-aligned contact to the DMOS transistor of the present invention.
Figure 5:
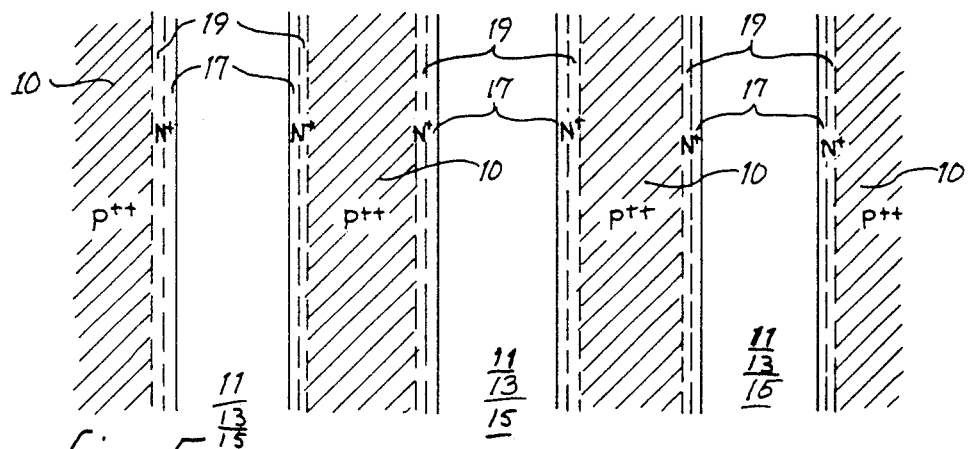
FIG. 5 is a top view of the structure of FIG. 4 ready for contact metalization.
Figure 6:
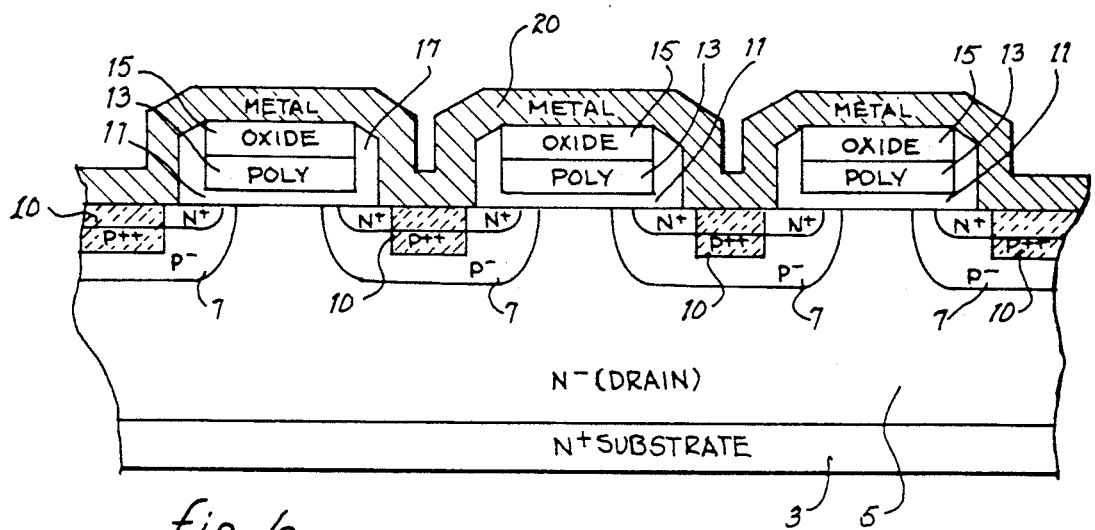
FIG. 6 is a side elevational sectional view of a completed, metallized DMOS device according to the present invention.

As an alternative embodiment to the above method and structure for achieving good electrical contact between the (N+) source regions 9 and the body contact (P++) regions 10, a method based on the structure of FIG. 4 may be utilized. The starting point is the structure illustrated in FIG. 2 before the implantation step which forms the body contact regions 10. A thin dielectric layer 19 is deposited over the entire semiconductor wafer 1. This layer has a thickness of preferably about 0.1 microns and comprises a material, such as silicon nitride, which may be etched without significant attack of the vertical sidewall dielectric regions 17. As illustrated in FIG. 4, the body contact regions 10 are formed by implantation of a species of second conductivity type through the thin dielectric layer 19 in order to overdope the central portions of the (N+) source regions 9 to form the (P++) body contact regions 10. These (P++) contact regions 10 are thus displaced from the edges of the polysilicon gates 13 by the thickness of the sidewall spacer 17 plus the thickness of the thin dielectric layer 19. Layer 19 is then etched away or removed entirely, leaving the structure depicted in top view in FIG. 5, where the (N+) source regions 9 are exposed all along the periphery of the gate between the sidewall dielectric spacers 17 and the (P++) body contact regions 10. The electrical shorting of (N+) source regions 9 to (P++) body contact regions 10 is effected by conventional metalization to form metal layer 20 as shown in FIG. 6. In this manner, the (P−) body regions 7 are everywhere shorted to the (N+) source region 9 with no more than about 0.6 microns spacings in a fully self-aligned structure.

While this invention has been particularly shown and described with respect to particular embodiments thereof, variations will be obvious to those skilled in the art. For example, the (N+) drain contact region 3 could be formed in the top surface of the semiconductor wafer in order to fabricate a lateral DMOS device. The scope of the invention is limited only by the following claims.

What is claimed is:

1. A method for fabricating a DMOS transistor comprising the steps of:

providing a semiconductor wafer including a relatively lightly doped drain region of a first conductivity type;

forming a gate structure comprising a gate insulator and a gate conductor, patterning said gate structure to form spaced-apart gate regions having opposed extremities, forming a body region of a second conductivity type opposite said first conductivity type using said spaced apart gate regions as a mask, forming a source region of said first conductivity type in said body region using said spaced apart gate regions as a mask, forming substantially vertical sidewall spacers of a first dielectric material type at said opposed extremities of said gate regions, forming a thin layer of a second dielectric material type over said gate structure and over said source region and conformal with said sidewall spacers, said second material type having a different etch rate than said first material type, (and)

forming a body contact region of said second conductivity type in the surface of said semiconductor wafer through said thin layer of said second material type by overdoping said source region between said sidewall spacers; and etching away said thin layer of said second material type without substantially etching said sidewall spacers of said first material type.

2. The method according to claim 1 wherein said first material type comprises an oxide, and said second material type comprises a nitride.

3. The method according to claim 1 wherein said sidewall spacers are about 0.5 microns thick.

4. The method according to claim 2 wherein said gate conductor is doped polysilicon.

5. The method according to claim 1 wherein the steps are performed in the order recited.

* * * * *